(12) United States Patent
Xie

(10) Patent No.: US 7,045,437 B1
(45) Date of Patent: May 16, 2006

(54) METHOD FOR FABRICATING SHALLOW TRENCHES

(75) Inventor: Ya-Hong Xie, Beverly Hills, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/169,243

(22) Filed: Jun. 27, 2005

(51) Int. Cl.
*H01L 21/76* (2006.01)

(52) U.S. Cl. .................. 438/448; 438/400; 438/405

(58) Field of Classification Search ................ 438/400, 438/405, 448
See application file for complete search history.

(56) References Cited

U.S. PATENT DOCUMENTS 4,748,489 A * 5/1988 Komatsu .................... 257/372

2005/0106835 A1 5/2005 Layadi et al.

\* cited by examiner

*Primary Examiner*—W. David Coleman
*Assistant Examiner*—Jarrett Stark
(74) *Attorney, Agent, or Firm*—Michael S. Davidson; Vista IP Law Group LLP

(57) ABSTRACT

A method of forming shallow trenches used, for example, in shallow trench isolation includes the steps of providing a p-type silicon substrate, forming a layer in the p-type silicon substrate, wherein the layer includes p-type silicon interposed between n-type silicon. The p-type silicon layer interposed between the n-type silicon is then subject to an anodization process to form porous silicon. The porous silicon regions are then oxidized. The porosity of the silicon layer may be controlled to create an isolation region that is either substantially flush with, above, or below an upper surface of the n-type top layer. For example, by adjusting the anodization time, a retrograde cross-sectional profile of the shallow trench can be obtained that leads to improved isolation between adjacent devices.

20 Claims, 3 Drawing Sheets

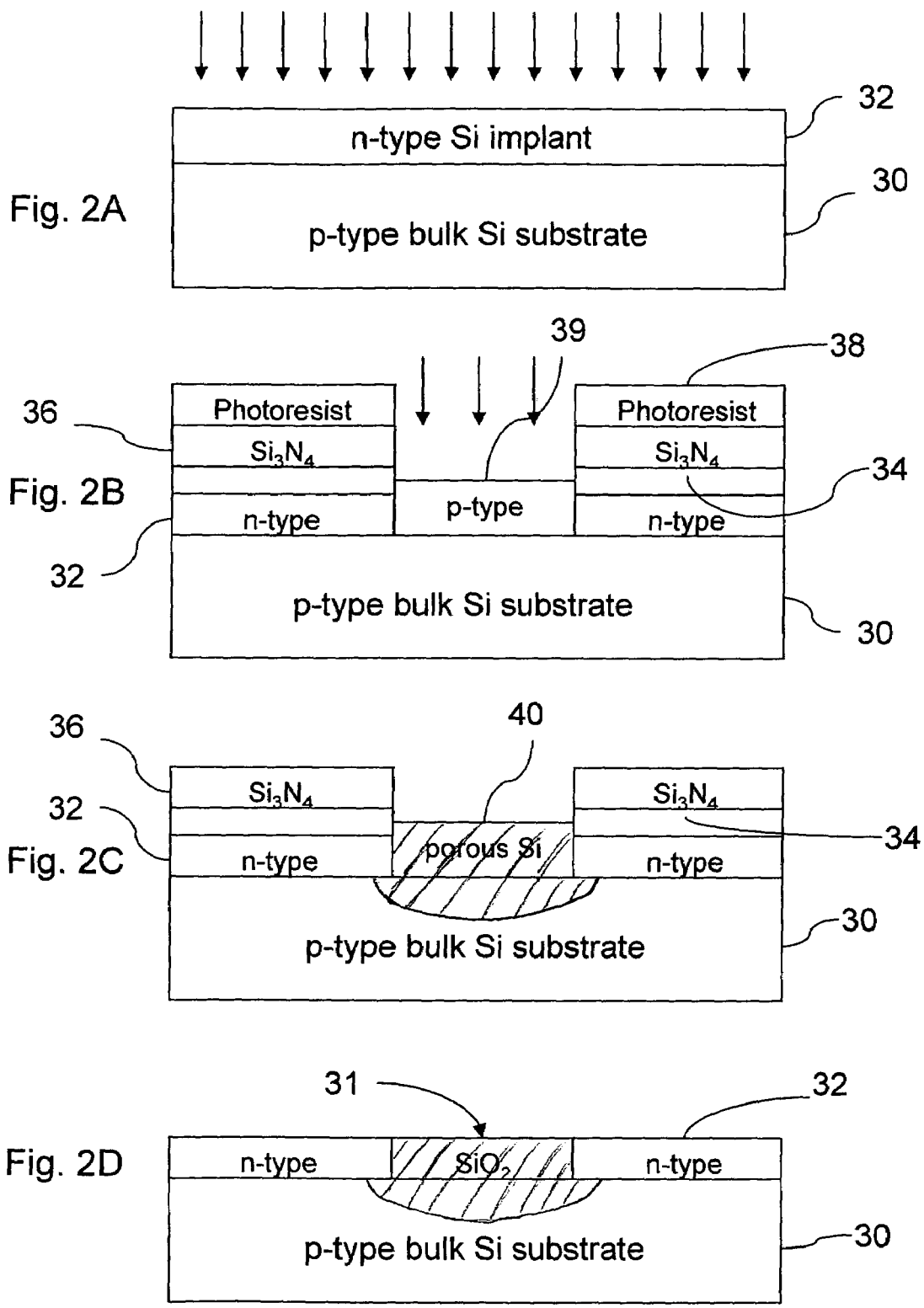

METHOD FOR FABRICATING SHALLOW TRENCHES

FIELD OF THE INVENTION

The field of the invention generally relates method used to fabricate shallow trenches in semiconductor devices. More particularly, the field of the invention relates to processes used to create trenches used for electrical isolation such as, for example, shallow trench isolation (STI).

BACKGROUND OF THE INVENTION

The semiconductor industry is increasingly being driven to decrease the size of semiconductor devices located on integrated circuits. For example, miniaturization is needed to accommodate the increasing density of circuits necessary for today's semiconductor products. Increased packing density and device size reduction has forced semiconductor device structures such as transistors to be located ever closer to one another. Because of the close proximity of adjacent transistors, methods have been developed to place electrical isolation structures between adjacent transistors. Several techniques or isolation processes have been employed to provide the requisite isolation in integrated semiconductor devices.

One such process is the local oxidation of silicon (LOCOS). In LOCOS, a thermally grown $SiO_2$ pad separates adjacent devices (e.g., PMOS and NMOS transistors in CMOS structure). Local oxidation is accomplished using silicon nitride ($Si_3N_4$) to prevent oxidation of silicon in selected areas. The $Si_3N_4$ may then be etched off following thermal oxidation. The LOCOS process has been used widely as an isolation technique for very large-scale integrated (VLSI) circuits. Unfortunately, LOCOS isolation processes have encountered limitations in smaller sub-micron technologies due to the well-known "bird's beak" that reduces the packing density.

An alternative isolation technique or process known as shallow trench isolation (STI) has been developed to provide electrical isolation between adjacent CMOS transistors. In STI, a shallow trench having a depth of around 2500 Å is created. The shallow trench is then filled by thermal oxidation. Unfortunately, the filling process creates a non-planar surface that requires chemical mechanical polishing (CMP) to planarize the resulting structure. The conventional STI process thus involves one mask level, one gas phase etching step, one oxidation step, and one CMP step. The cross-sectional profile of the oxide is generally controlled by the dry etching conditions.

Regardless of the process used, the isolation structure that is created is characterized by its isolation effectiveness between the source and drain regions between neighboring transistors as well as between the source and drain of the same transistor (when turned off). Important metrics for the effectiveness of a particular isolation structure include the highest voltage the structure can withstand before significant current flow, the source-to-drain leakage when the transistor is in the "off" state, and the severity of the short channel effect.

As stated above, conventional STI processes include a CMP planarization step. Unfortunately, CMP processes are generally expensive and often introduce a number of yield-limiting defects. These include residual slurry, surface voids, and surface particles. Microscratches may also form if a small particle or other debris is caught between the polishing pad and the surface of the substrate during polishing.

There thus is a need for a STI-based process that does not require a CMP planarization step. The process would be able to form a perfect or near-perfect planar topography on the substrate comparable to that provided by CMP-based processes. In addition, there is a need for an alternative process for fabricating STI structures that offer the ability to tailor the cross-sectional profile of the trenches for improved electronic properties.

SUMMARY OF THE INVENTION

In one aspect of the invention, a method of forming an isolation structure in a substrate includes the steps of providing a substrate of p-type silicon and forming an n-type layer on the p-type silicon substrate. The n-type layer may be formed, for example, by ion implantation. A silicon dioxide ($SiO_2$) layer is deposited on the n-type layer followed by a silicon nitride ($Si_3N_4$) layer. The silicon nitride and silicon dioxide layers are selectively removed where the isolation structure (e.g., shallow trench) is to be located so as to expose a portion of the n-type layer. The n-type layer is then subject to ion implantation to form a p-type region. Porous silicon is then formed in the p-type region. The porous silicon is then oxidized to form the isolation structure.

In another aspect of the invention, a method of forming an isolation structure in a substrate includes the steps of providing a p-type silicon substrate and deposing a layer of silicon dioxide on the p-type silicon substrate and a silicon nitride layer on the silicon dioxide layer. A mask is provided over the p-type silicon substrate. At least a portion of the silicon dioxide and silicon nitride layers are removed. The exposed p-type silicon substrate layer is then subject to n-type ion implantation to form n-type regions adjacent to a p-type region. The p-type region is then converted into porous silicon. The porous silicon is then oxidized to form an isolation structure.

In still another aspect of the invention, a method of forming an isolation structure in a substrate includes the steps of providing a p-type silicon substrate and forming a top layer on the p-type silicon substrate, wherein the top layer includes p-type silicon interposed between n-type silicon. Porous silicon is then formed in the p-type silicon region of the top layer. The porous silicon is then oxidized to form the isolation structure.

In one aspect of the invention, the oxidized porous silicon is substantially flush with an upper surface of the n-type layer. In another aspect of the invention, the oxidized porous silicon used to form the isolation structure projects above an upper surface of the n-type layer. In still another aspect of the invention, the oxidized porous silicon used to form the isolation structure is recessed below an upper surface of the n-type layer. The above-noted configurations can be achieved by controlling the porosity of the porous silicon.

Further features and advantages will become apparent upon review of the following drawings and description of the preferred embodiments.

BRIEF DESCRIPTION OF THE DRAWINGS

FIGS. 2A–2D illustrate the steps for fabricating shallow trenches in semiconductor devices according to one embodiment of the invention.

DETAILED DESCRIPTION OF THE PREFERRED EMBODIMENTS

Figure 1:
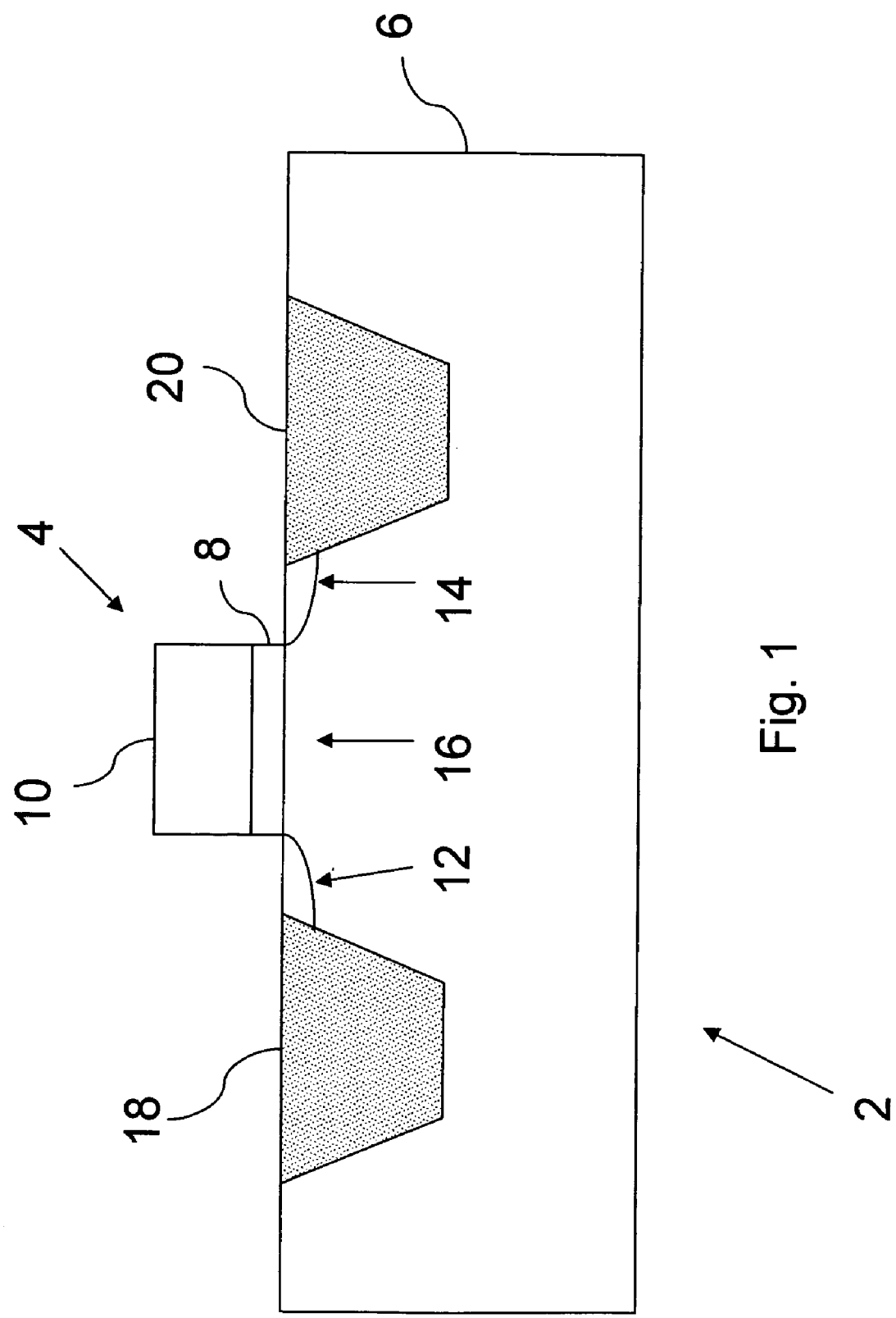
FIG. 1 illustrates a cross-sectional view of one embodiment of a semiconductor device constructed in accordance with the trench fabrication method disclosed herein.

FIG. 1 illustrates a cross-sectional view of a semiconductor device 2 constructed in accordance with the trench fabrication methods described herein. FIG. 1 illustrates a semiconductor device 2 in the form of a CMOS transistor 4 formed on a substrate 6. The transistor 4 includes a gate oxide region 8 and an overlying gate electrode 10. The transistor 4 includes a source 12 and drain 14 region as well as a corresponding channel region 16 located there between and beneath the gate oxide region 8. Still referring to FIG. 1, the semiconductor device 2 includes isolation regions disposed on all sides of the transistor 4 (Two such regions 18, 20 are shown in FIG. 1). The isolation region 18, 20 may take the form of a shallow trench such as that shown in FIG. 1 and serves to isolate the transistor 4 (e.g., source and drain regions 12, 14) from neighboring transistors 4 (not shown).

FIGS. 2A, 2B, 2C, and 2D illustrate cross-sectional views of a substrate 30 and associated layers for forming a single isolation region 31 (e.g. isolation regions 18, 20 shown in FIG. 1 and isolation region 31 in FIG. 2D). While FIGS. 2A–2D illustrate the formation of a single isolation region 31, it should be understood that the processes and methods described herein may be implemented to form multiple isolation regions 31 across a single substrate 30.

With reference now to FIG. 2A, a p-type silicon substrate 30 is provided. The p-type silicon substrate 30 is then subject to n-type ion implantation (see arrows in FIG. 2A) that overcompensates the p-type substrate 30 so as to form a surface layer 32 of n-type silicon. The n-type surface layer 32 has a doping concentration slightly higher than that present in the underlying p-type silicon substrate 30. The substrate 30 containing the n-type surface layer 32 is then subject to a thermal anneal process to activate the implanted dopants. In one aspect of the method, the resulting n-type layer 32 should have a thickness, $t_n$, that is greater than the required thickness or depth of the isolation region 31 (e.g., shallow trench). However, in an alternative aspect of the invention, the thickness of the n-type layer is thinner than the final oxide thickness. This construction may be desirable for many circuits where a retrograde cross-sectional profile of the oxide region is desired (e.g. as shown in FIGS. 2C and 2D. In another aspect of the invention, a blank $SiO_2$ mask layer (not shown) is used to control the profile of the isolation region 31. The use of a blank $SiO_2$ mask layers in such a fashion is well known to those skilled in semiconductor manufacturing processes.

With reference now to FIG. 2B, a relatively thin oxide or pad layer 34 is deposited on the exposed n-type surface layer 32. In one preferred aspect of the invention, the pad layer 34 is has a thickness of approximately 100 Å. The pad layer 34 is followed be a thicker $Si_3N_4$ layer 36 (e.g., a $Si_3N_4$ containing layer). The $Si_3N_4$ layer 36 is deposited on the substrate 30 using, for example, LPCVD techniques. In one aspect of the process, the $Si_3N_4$ layer 36 has a thickness of approximately 1000 Å. The combination of the pad oxide layer 24 and $Si_3N_4$ layer 36 are well known in silicon-VLSI industry.

Next, the $SiO_2/Si_3N_4$ stack is patterned with a photoresist layer 38 and is etched so as to expose the areas or portions of the substrate 30 where the isolation region 31 (e.g., trench) is to be exposed. For example, techniques used in conventional LOCOS processes may be used to expose or otherwise make available the isolation regions 31. Next, the substrate 30 is then subject to p-type ion implantation (shown by arrows in FIG. 2B) to convert the region of silicon 39 used to form the isolation region 31 into p-type silicon. P-type ion implantation is preferably done at a dose or dosages to over-compensate the doping level in the n-type layer 32. Multiple energy implants may be required in order to achieve substantially uniform doping concentration throughout the thickness of the layer 32. Following p-type ion implantation, the photoresist layer 38 is removed and the substrate 30 is then subject to an annealing process to activate the dopants.

Referring now to FIG. 2C, the substrate 30 is then subject to an anodization process to selectively form porous silicon 40 in the p-type regions 39 formed by ion implantation. The porous silicon 40 includes a network of silicon permeated by pores. Any number of methods known to form porous silicon may be used in accordance with the methods described herein. For example, electrochemical anodization of the p-type silicon may take place in a tank or cell using a hydrofluoric acid (HF) based electrolyte. Electrochemical anodization may take place, for example, using a single-tank or double-tank cell. The single-tank and double-tank cells are well known devices used to form porous silicon and are not described in detail herein.

In a preferred aspect of the invention, the characteristics of the porous silicon 40 formed in the p-type regions 39 may be controlled or optimized for the particular isolation region 31. For example, the anodization process may be tailored to provide porous silicon 40 having certain physical characteristics such as, for example, the size of the pores and branches, the porosity of the silicon, the pore and branch orientation, and the overall thickness of the porous silicon 40. Generally, these parameters may be controlled by the amount and type of doping used to form the p-type layer, the concentration of the electrolyte (e.g., HF concentration), the pH of the electrolyte, the anodization current density, and the anodization time.

In one aspect of the process, a substantially flat topography between the field oxide 31 and the n-type layer 32 is desired (i.e., the top of the porous silicon 40 is substantially flush with the top of the n-type layer 32). In this embodiment, the porous silicon 40 has a porosity within the range of about 50% to about 60% and, more preferably, a porosity of about 55%. This is due to the fact that silicon expands approximately 2.2 times in volume upon oxidation.

With reference now to FIG. 2D, the substrate 30 then undergoes oxidation. Oxidation involves, for example, immersing the substrate 30 in an environment containing an oxidant and/or maintaining the substrate 30 at an elevated temperature in an oxygen-containing environment. Alternatively, photo-oxidation or other well known oxidation techniques known to those skilled in the art may also be employed. Preferably, during the oxidation process, the regions containing porous silicon 40 are completely oxidized while the oxide thickness in the bulk substrate 30 is minimal, for example, on the order of 100 Å. In addition, during the oxidation process, oxidation will take place a the edge region of the $Si_3N_4$ mask layer 36, forming the well known "birds beak" structure or pinch. The oxidation encroachment, as well as the natural increase of lateral straggle that accompanies implant depth in typical ion implantation processes result in an "hour glass" shaped cross-sectional profile of the isolation region 31 (e.g., isolation trench). Generally, the "hour glass" cross-sectional profile will provide for better isolation between neighboring semiconductor devices 2 (e.g., transistors) while preventing the formation of a high-field region along the perimeter of the active silicon region.

In alternative aspects of the process, it may be desirable to form an isolation region 31 that projects above or is recessed below the adjacent n-type silicon layer 32. This may be accomplished, for example, by controlling the porosity of the porous silicon 40 during the anodization step. In addition, the amount or degree of retrograde at the lowermost region of the isolation region 31, such as that shown in FIGS. 2C and 2D, as well as the extent of the "birds beak" formation may be adjusted by controlling the oxidation conditions. For example, the degree of retrograde may be controlled by controlling the anodization time. Retrograde of the isolation region 31 under the source and drain regions 12, 14 of the semiconductor device 2 reduces the source/drain-to-substrate capacitance.

In another aspect of the invention, an optional channel-stop implant (not shown) may be formed either prior to or after the oxidation step shown in FIG. 2D. With respect to semiconductor device 2 formation, the process described above may be followed by processes used to form separate p-tubs and n-tubs using conventional processes such as, for example, p-type ion implantation. Finally, in the case where the semiconductor device 2 forms a field-effect transistor (FET), another level of photolithography may be added to form an oxide stripe or similar structure that is connected to the shallow trench 31 and disposed directly underneath the channel region to minimize the short channel effect.

One of the key features of the process is that the cross-sectional shape of the shallow trench is tunable by controlling the porosity and the depth of the porous region. In the state-of-the-art VLSI, the dimension of individual transistors is on the order of 100 nm. For such small dimensions, the strain in the shallow trench could affect the strain in the FET channel region significantly. For shallow trenches formed by oxidation, the stress applied to the channel region is compression. Compressively-strained channel regions have been shown to improve the mobility of holes in p-MOSFETs. By controlling the porosity and the shape of the trench cross-section, the strain in the channel region can be tailored from zero to significantly compressive. This is yet another advantage of the process.

Figure 3A:
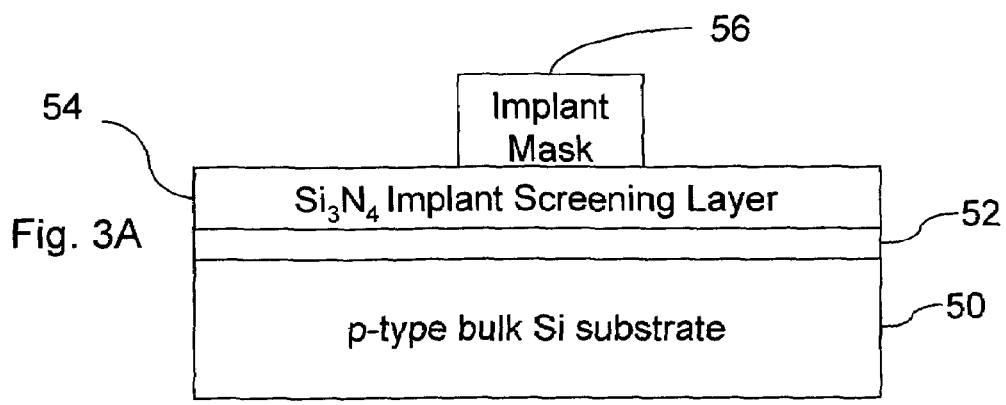
FIGS. 3A–3C illustrate the steps for fabricating shallow trenches in semiconductor devices according to another embodiment of the invention.
Figure 3B:
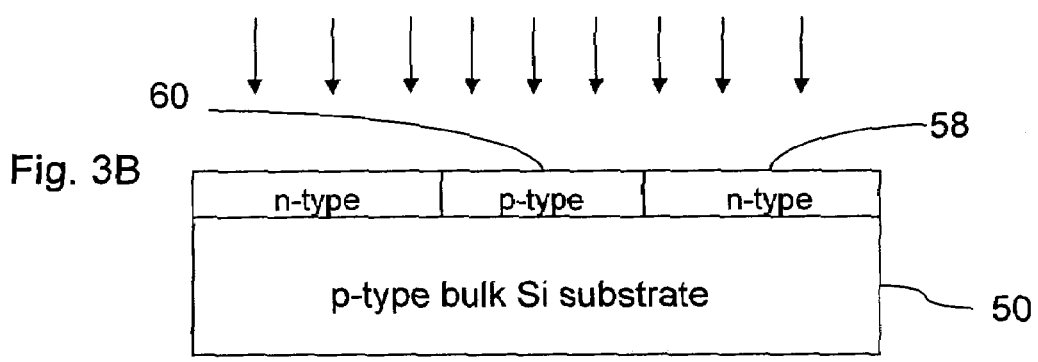
Figure 3C:
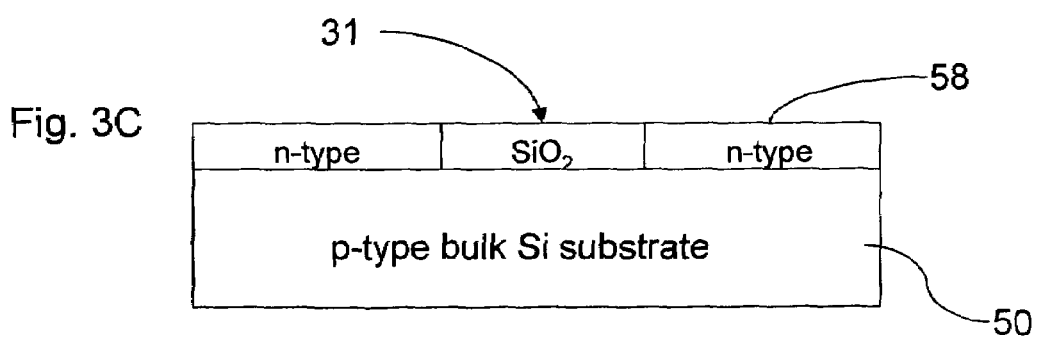

FIGS. 3A, 3B, and 3C illustrate an alternative process for forming one or more isolation regions 31. Unlike the process disclosed in FIGS. 2A–2D, isolation regions 31 may be formed using a single ion implantation step (n-type). There is no need for a second ion implantation step to convert n-type silicon to p-type. Referring to FIG. 3A, a p-type silicon substrate 50 is provided with a relatively thin pad oxide layer 52 covered by an $Si_3N_4$ ion implant screening layer 54. A mask 56 is provided over the $Si_3N_4$ ion implant screening layer 54 at the location where the isolation regions(s) 31 are to be formed.

As seen in FIG. 3B, the substrate 50 is then subject to n-type ion implantation (as shown by arrows in FIG. 3B). During this step, the top surface layer 58 of the exposed regions of the substrate 50 is converted to n-type silicon. Multiple energy implants may be required to achieve a substantially uniform doping concentration throughout the top layer. The portion 60 of the substrate 50 located beneath the mask 56 is not converted to n-type silicon (remains p-type). The substrate 50 is then subject to an anodization process and subsequent oxidation step as is described in detail above with respect to FIGS. 2A–2D so as to form porous silicon in the isolation region 31. The process described in FIGS. 3A–3D may be particularly useful in the creation of narrow isolation regions 31 (e.g., trenches) because of the non-zero lateral straggle of ion implantation that leads to the retrograded implantation profile. The resulting p-region is thus smaller (i.e., narrower) than the width of the mask.

The methods described herein are advantageous over prior methods because they eliminate the need for subsequent CMP processing. CMP processing is often expensive and introduce a number of yield-limiting defects. The processes disclosed herein are able to form isolation regions with perfect or near-perfect planar topology. In addition, the processes allow the tailoring the cross-sectional profiles of the isolation regions to optimize electronic performance.

While embodiments of the present invention have been shown and described, various modifications may be made without departing from the scope of the present invention. The invention, therefore, should not be limited, except to the following claims, and their equivalents.

What is claimed is:

1. A method of forming an isolation structure in a substrate comprising:
   a) forming an n-type layer in a p-type silicon substrate;
   b) depositing a $Si_3N_4$ containing layer over the n-type layer;
   c) exposing at least a portion of the n-type layer by removing at least a portion of the $Si_3N_4$ containing layer;
   d) forming a p-type region by exposing a portion of the n-type layer to p-type ion implantation and an annealing;
   e) forming porous silicon in the p-type region in step (d); and
   f) oxidizing at least a portion of the porous silicon.

2. The method of claim 1, further comprising the step of removing the remaining $Si_3N_4$ containing layer from the substrate.

3. The method of claim 1, wherein the oxidized porous silicon is substantially flush with an upper surface of the n-type layer.

4. The method of claim 1, wherein the oxidized porous silicon projects above an upper surface of the n-type layer.

5. The method of claim 1, wherein the oxidized porous silicon is recessed below an upper surface of the n-type layer.

6. The method of claim 1, wherein the n-type layer has a thickness that is less than the thickness of the oxidized porous silicon.

7. The method of claim 1, wherein porous silicon is formed by an anodization process.

8. The method of claim 1, wherein the formation of the n-type layer in the p-type silicon substrate is formed by n-type ion implantation.

9. The method of claim 1, wherein the isolation structure includes a lower retrograde portion.

10. A method of forming an isolation structure in a substrate comprising:
    a) depositing a $Si_3N_4$ containing layer on a p-type silicon substrate;
    b) providing a mask over the p-type silicon substrate;
    c) removing at least a portion of the $Si_3N_4$ containing layer;
    d) subjecting an exposed p-type silicon substrate layer to n-type ion implantation to form n-type regions adjacent to a p-type region;
    e) forming porous silicon in the p-type region in step (d); and
    f) oxidizing at least a portion of the porous silicon.

11. The method of claim 10, further comprising the step of removing the remaining $Si_3N_4$ containing layer from the substrate.

12. The method of claim 10, wherein the oxidized porous silicon is substantially flush with an upper surface of the n-type layer.

13. The method of claim 10, wherein the oxidized porous silicon projects above an upper surface of the n-type layer.

14. The method of claim 10, wherein the oxidized porous silicon is recessed below an upper surface of the n-type layer.

15. The method of claim 10, wherein the isolation structure has a retrograde cross-sectional profile.

16. The method of claim 10, wherein porous silicon is formed by an anodization process.

17. A semiconductor device produced by the method of claim 1.

18. A semiconductor device produced by the method of claim 10.

19. A method of forming an isolation structure in a substrate comprising:
   a) forming a layer on top of a p-type silicon substrate, wherein the layer comprises p-type silicon interposed between n-type silicon;
   b) forming porous silicon in the portion of the p-type silicon formed in step (a); and
   c) oxidizing at least a portion of the porous silicon.

20. The method of claim 19, wherein the oxidized porous silicon is substantially flush with an upper surface of the n-type layer.

* * * * *